United States Patent
Ding

(10) Patent No.: US 8,997,686 B2
(45) Date of Patent: Apr. 7, 2015

(54) SYSTEM FOR AND METHOD OF FAST PULSE GAS DELIVERY

(75) Inventor: Junhua Ding, Tewksbury, MA (US)

(73) Assignee: MKS Instruments, Inc., Andover, MA (US)

(*) Notice: Subject to any disclaimer, the term of this patent is extended or adjusted under 35 U.S.C. 154(b) by 1075 days.

(21) Appl. No.: 12/893,554

(22) Filed: Sep. 29, 2010

(65) Prior Publication Data

US 2012/0073672 A1    Mar. 29, 2012

(51) Int. Cl.
| | |
|---|---|
| C23C 16/455 | (2006.01) |
| C23C 16/52 | (2006.01) |
| C23F 1/00 | (2006.01) |
| H01L 21/306 | (2006.01) |
| C23C 16/448 | (2006.01) |
| G05D 7/06 | (2006.01) |
| C23C 16/06 | (2006.01) |
| C23C 16/22 | (2006.01) |

(52) U.S. Cl.
CPC .............. *C23C 16/52* (2013.01); *C23C 16/448* (2013.01); *C23C 16/45523* (2013.01); *C23C 16/45561* (2013.01); *G05D 7/0647* (2013.01)

(58) Field of Classification Search
USPC ............ 118/696, 695, 704, 118; 156/345.24, 156/345.26; 137/12, 14, 141, 142, 145
See application file for complete search history.

(56) References Cited

U.S. PATENT DOCUMENTS

| | | | |
|---|---|---|---|
| 4,783,343 A * | 11/1988 | Sato ................................. 427/8 |
| 4,916,089 A | 4/1990 | Suchtelen et al. | |
| 5,524,084 A | 6/1996 | Wang et al. | |
| 5,565,038 A * | 10/1996 | Ashley ............................. 134/2 |
| 5,865,205 A * | 2/1999 | Wilmer ............................ 137/2 |
| 6,089,537 A | 7/2000 | Olmsted | |
| 6,119,710 A * | 9/2000 | Brown ............................ 137/14 |

(Continued)

FOREIGN PATENT DOCUMENTS

| | | |
|---|---|---|
| CN | 101023199 | 8/2007 |
| DE | 102004015174 | 10/2005 |

(Continued)

OTHER PUBLICATIONS

JPO Machine Translation for JP06-045256A.*

(Continued)

*Primary Examiner* — Rudy Zervigon
(74) *Attorney, Agent, or Firm* — McDermot Will & Emery LLP

(57) ABSTRACT

A system for and method of delivering pulses of a desired mass of gas to a tool is described. A system for delivering pulses of a desired mass of gas to a process chamber or tool, comprising: a gas delivery chamber; a first valve arranged so as to control the flow of gas into the gas delivery chamber; a second valve arranged so as control the flow of gas leaving the gas delivery chamber so that the gas can leave the gas delivery chamber in pulses, each of a selected mass as a function of the initial pressure of the gas in the gas delivery chamber and the duration of the respective pulse; and a pressure control arrangement configured and arranged so as to control the flow of gas into the gas delivery chamber so as to precharge the gas in the gas delivery chamber to an initial pressure set point prior to delivering the pulses of gas such that the variance of the starting pressure of the gas in the gas delivery chamber is controlled prior to delivering the pulses of gas, and the repeatability of the mass delivery is improved as a function of the duration of each of the pulses.

17 Claims, 4 Drawing Sheets

(56) References Cited

U.S. PATENT DOCUMENTS

| | | | |
|---|---|---|---|
| 6,125,869 A * | 10/2000 | Horiuchi | 137/1 |
| 6,503,330 B1 * | 1/2003 | Sneh et al. | 118/715 |
| 6,631,334 B2 * | 10/2003 | Grosshart | 702/50 |
| 6,638,859 B2 * | 10/2003 | Sneh et al. | 438/680 |
| 6,820,632 B2 * | 11/2004 | Ohmi et al. | 137/14 |
| 6,911,092 B2 * | 6/2005 | Sneh | 118/715 |
| 6,913,031 B2 * | 7/2005 | Nawata et al. | 137/12 |
| 7,428,373 B2 * | 9/2008 | Sandhu | 392/386 |
| 7,474,968 B2 * | 1/2009 | Ding et al. | 702/45 |
| 7,615,120 B2 * | 11/2009 | Shajii et al. | 118/666 |
| 7,628,860 B2 * | 12/2009 | Shajii et al. | 118/666 |
| 7,628,861 B2 * | 12/2009 | Clark | 118/666 |
| 7,662,233 B2 | 2/2010 | Sneh | |
| 7,735,452 B2 | 6/2010 | Spartz | |
| 7,794,544 B2 | 9/2010 | Nguyen et al. | |
| 7,829,353 B2 * | 11/2010 | Shajii et al. | 438/5 |
| 8,297,223 B2 * | 10/2012 | Liu et al. | 118/723 VE |
| 2002/0007790 A1 * | 1/2002 | Park | 118/715 |
| 2003/0180458 A1 * | 9/2003 | Sneh | 427/248.1 |
| 2004/0050326 A1 | 3/2004 | Thilderkvist et al. | |
| 2004/0244837 A1 * | 12/2004 | Nawata et al. | 137/487.5 |
| 2005/0081787 A1 | 4/2005 | Im et al. | |
| 2005/0103264 A1 | 5/2005 | Jansen | |
| 2005/0160983 A1 * | 7/2005 | Sneh | 118/715 |
| 2005/0196533 A1 | 9/2005 | Hasebe et al. | |
| 2005/0223979 A1 * | 10/2005 | Shajii et al. | 118/692 |
| 2005/0249876 A1 * | 11/2005 | Kawahara et al. | 427/255.34 |
| 2006/0032442 A1 | 2/2006 | Hasebe | |
| 2006/0060139 A1 | 3/2006 | Meneghini et al. | |
| 2006/0130744 A1 * | 6/2006 | Clark | 117/86 |
| 2006/0130755 A1 | 6/2006 | Clark | |
| 2006/0207503 A1 | 9/2006 | Meneghini et al. | |
| 2007/0026540 A1 | 2/2007 | Nooten et al. | |
| 2007/0039549 A1 * | 2/2007 | Shajii et al. | 118/715 |
| 2007/0204702 A1 | 9/2007 | Melcer et al. | |
| 2008/0095936 A1 | 4/2008 | Senda et al. | |
| 2008/0167748 A1 | 7/2008 | Ding | |
| 2009/0004836 A1 | 1/2009 | Singh et al. | |
| 2009/0008369 A1 | 1/2009 | Nozawa et al. | |
| 2009/0163070 A1 | 6/2009 | Wang | |
| 2009/0248213 A1 | 10/2009 | Gotoh | |
| 2010/0125424 A1 | 5/2010 | Ding et al. | |
| 2011/0174219 A1 | 7/2011 | Meneghini | |
| 2012/0073672 A1 * | 3/2012 | Ding | 137/14 |
| 2012/0076935 A1 | 3/2012 | Ding | |

FOREIGN PATENT DOCUMENTS

| | | |
|---|---|---|
| EP | 0969342 | 1/2000 |
| EP | 2006414 | 12/2008 |
| JP | 61-229319 | 10/1986 |
| JP | 06-045256 | 2/1994 |
| JP | 2000200780 | 7/2000 |
| JP | 2000200780 A * | 7/2000 |
| JP | 2002-329674 | 11/2002 |
| JP | 2006222141 | 8/2006 |
| JP | 2006222141 A * | 8/2006 |
| JP | 2007-535617 | 12/2007 |
| JP | 2008-091625 | 4/2008 |
| JP | 2009-530737 | 8/2009 |
| WO | 02/073329 | 9/2002 |
| WO | 2005/103328 | 11/2005 |
| WO | 2007/108871 | 9/2007 |
| WO | WO 2008/112423 | 9/2008 |

OTHER PUBLICATIONS

The International Search Report and The Written Opinion of The International Searching Authority from Corresponding PCT Application No. PCT/US2012/026519 dated Jun. 18, 2012.

International Search Report and the Written Opinion from corresponding PCT/US2011/053618 dated Jan. 16, 2012.

International Search Report and the Written Opinion from corresponding PCT/US2011/053614 dated Dec. 9, 2011.

Office Action dated Apr. 2, 2014 from Corresponding Japanese Application No. 2013-531758.

Office Action dated Apr. 2, 2014 from Corresponding Japanese Application No. 2013-531756.

Search Report dated Jan. 11, 2014 from Corresponding Taiwan Patent Application No. 100135295.

Taiwan Version of Office Action dated Jan. 22, 2014 from Corresponding Taiwan Patent Application No. 100135295.

Office Action dated Jul. 2, 2014 from Corresponding Chinese Application No. 201180056074.1.

Office Action dated Nov. 24, 2014 from corresponding German Application No. 112011103330.3.

Office Action dated Nov. 27, 2014 from corresponding German Application No. 112011103337.0.

* cited by examiner

SYSTEM FOR AND METHOD OF FAST PULSE GAS DELIVERY

BACKGROUND

1. Field

This disclosure relates generally to gas delivery devices, and more particularly to a method of and system for fast pulse gas delivery. As used herein the term "gas" includes the term "vapors" should the two terms be consider different.

2. Overview

The manufacture or fabrication of semiconductor devices often requires the careful synchronization and precisely measured delivery of as many as a dozen gases to a process tool such as a vacuum processing chamber. Various recipes are used in the manufacturing process, and many discrete processing steps, where a semiconductor device is cleaned, polished, oxidized, masked, etched, doped, metalized, etc., can be required. The steps used, their particular sequence, and the materials involved all contribute to the making of particular devices.

As more device sizes have shrunk below 90 nm, atomic layer deposition, or ALD processes continues to be required for a variety of applications, such as the deposition of barriers for copper interconnects, the creation of tungsten nucleation layers, and the production of highly conducting dielectrics. In the ALD process, two or more precursor gases are delivered in pulses and flow over a wafer surface in a process chamber maintained under vacuum. The two or more precursor gases flow in an alternating or sequential manner so that the gases can react with the sites or functional groups on the wafer surface. When all of the available sites are saturated from one of the precursor gases (e.g., gas A), the reaction stops and a purge gas is used to purge the excess precursor molecules from the process chamber. The process is repeated, as the next precursor gas (i.e., gas B) flows over the wafer surface. For a process involving two precursor gases, a cycle can be defined as one pulse of precursor A, purge, one pulse of precursor B, and purge. A cycle can include the pulses of additional precursor gases, as well as repeats of a precursor gas, with the use of a purge gas in between successive pulses of precursor gases. This sequence is repeated until the final thickness is reached. These sequential, self-limiting surface reactions result in one monolayer of deposited film per cycle.

The pulses of precursor gases into the processing chamber are normally controlled using on/off-type valves which are simply opened for a predetermined period of time to deliver a desired amount (mass) of precursor gas with each pulse into the processing chamber. Alternatively, a mass flow controller, which is a self-contained device comprising a transducer, control valve, and control and signal-processing electronics, is used to deliver an amount of gas (mass) at predetermined and repeatable flow rates, in short time intervals. In both cases, the amount of material (mass) flowing into the process chamber is not actually measured, but inferred from measuring parameters of the ideal gas law.

Systems known as pulse gas delivery (PGD) devices have been developed that can measure and deliver pulsed mass flow of precursor gases into semiconductor processing chambers and other processing tools. Such devices are designed to provide repeatable and precise quantities (mass) of gases for use in semiconductor manufacturing processes, such as atomic layer deposition (ALD) processes.

PGDs usually include a delivery reservoir or chamber containing the gas to be delivered during the ALD process upstream to the processing chamber or tool. By measuring the pressure and temperature of the gas in the delivery chamber, and controlling the flow of gas from the delivery chamber as a function of the pressure drop of the gas in the chamber during delivery, the mass of a pulse of gas delivered during the ALD can be precisely controlled. The flow of the pulse of gas from the chamber is controlled with an on/off-type outlet valve between the delivery chamber of the PGD and the process tool receiving the gas. The amount of time the valve is required to be open to deliver a pulse of gas of a given mass is a further function of the starting pressures of the gas in the chamber and the downstream pressure of the processing chamber or tool. For example, for a given amount of gas that needs to be delivered, the starting pressure in the delivery chamber at a higher starting pressure requires a shorter time for the valve to be open than at a lower starting pressure since the mass flow occurs more quickly at the higher starting pressure. The charge period and the delivery period of PGDs should be tightly controlled for fast pulse gas delivery applications in order to insure accurate delivery of prescribed amounts of gas(es). As a result, the upstream pressure of the PGDs as well as the charged pressure in the PGDs should be tightly controlled in order to meet the repeatability and the accuracy requirement of the ALD process.

Further, the inlet and outlet valves in the PGD have a finite response time to transition from one state (on/off) to another state (off/on) when the valves are commanded for either charging the chamber or delivering the gas pulse. For example, a typical response time of pneumatic shut-off valves in ALD applications is between about 5 and 35 milliseconds. The response time of the valves can introduce a delay to a response to the valve command sent by the PGD controller, which causes either an overcharging of the PGD chamber or overdelivering of the gas pulse to the processing chambers or tools as illustrated in FIG. 2. For example, in the charging mode of the PGD, the outlet valve is shut, the inlet valve is open for gas to enter the delivery chamber of the PGD, and the PGD controller monitors the pressure change. The PGD controller needs to send a shut-off command to the inlet valve early before the delivery chamber reaches the pressure setpoint by considering the response time (or delay) of the inlet valve; otherwise, the delivery chamber can be overcharged or the delivery chamber pressure is above the setpoint.

More recently, certain processes have recently been developed that require high speed pulsed or time-multiplexed processing. For example, the semiconductor industry is developing advanced, 3-D integrated circuits thru-silicon vias (TSVs) to provide interconnect capability for die-to-die and wafer-to-wafer stacking. Manufacturers are currently considering a wide variety of 3-D integration schemes that present an equally broad range of TSV etch requirements. Plasma etch technology such as the Bosch process, which has been used extensively for deep silicon etching in memory devices and MEMS production, is well suited for TSV creation. The Bosch process, also known as a high speed pulsed or time-multiplexed etching, alternates repeatedly between two modes to achieve nearly vertical structures using $SF_6$ and the deposition of a chemically inert passivation layer using $C_4F_8$. Targets for TSV required for commercial success are: adequate functionality, low cost and proven reliability.

Currently, there are two prior art approaches for high speed pulse gas delivery in a Bosch process. The first prior art approach is to use fast response mass flow controllers (MFCs) to turn on and off gas flows of the delivery pulse gases. This method suffers from slow delivery speed, and poor repeatability and accuracy. The second prior art approach involves using MFCs coupled with downstream three-way valves. The MFCs maintain constant flow and the downstream three-way valves switch between the process line and the divert dump line frequently in order to deliver pulse gases to the process chamber. Clearly, a lot of gases are wasted, which increases the process cost. The second method also suffers from repeatability and accuracy of delivery. Thus, it is desirable to provide a solution for high speed pulse delivery applications, such as the Bosch process used for TSV creation, that reduce or overcome these problems.

DESCRIPTION OF RELATED ART

Examples of pulse mass flow delivery systems can be found in U.S. Pat. Nos. 7,615,120; 7,628,860, 7,662,233 and 7,735,452; and U.S. Patent Publication Nos. 2006/00601139; and 2006/0130755.

SUMMARY

As discussed above, the starting chamber pressure of the delivery chamber is critical for repeatability of pulse gas delivery. Hence, by tightly controlling the variance of the starting chamber pressure before the pulse gas delivery, one can improve the repeatability of the gas pulse delivery.

Accordingly, in accordance with one aspect of the teachings described herein, a system for delivering pulses of a desired mass of gas to a process chamber or tool, comprising: a gas delivery chamber; a first valve arranged so as to control the flow of gas into the gas delivery chamber; a second valve arranged so as control the flow of gas leaving the gas delivery chamber so that the gas can leave the gas delivery chamber in pulses, each of a selected mass as a function of the initial pressure of the gas in the gas delivery chamber and the duration of the respective pulse; and a pressure control arrangement configured and arranged so as to control the flow of gas into the gas delivery chamber so as to precharge the gas in the gas delivery chamber to an initial pressure set point prior to delivering the pulses of gas such that the variance of the starting pressure of the gas in the gas delivery chamber is controlled prior to delivering the pulses of gas, and the repeatability of the mass delivery is improved as a function of the duration of each of the pulses. In accordance with another aspect of the teachings described herein, a method of delivering pulses of a desired mass of gas to a tool, comprises:

controlling the flow of gas into the gas delivery chamber, and controlling the flow of gas leaving the gas delivery chamber so that the gas can leave the gas delivery chamber in pulses, each of a selected mass as a function of the initial pressure of the gas in the gas delivery chamber and the duration of the respective pulse; and precharging the gas in the gas delivery chamber to an initial pressure set point prior to delivering the pulses of gas such that the variance of the starting pressure of the gas in the gas delivery chamber is controlled prior to delivering the pulses of gas, and the repeatability of the mass delivery is improved as a function of the duration of each of the pulses.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. When the same numeral appears in different drawings, it refers to the same or like components or steps.

DETAILED DESCRIPTION OF ILLUSTRATIVE EMBODIMENTS

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

Figure 1:
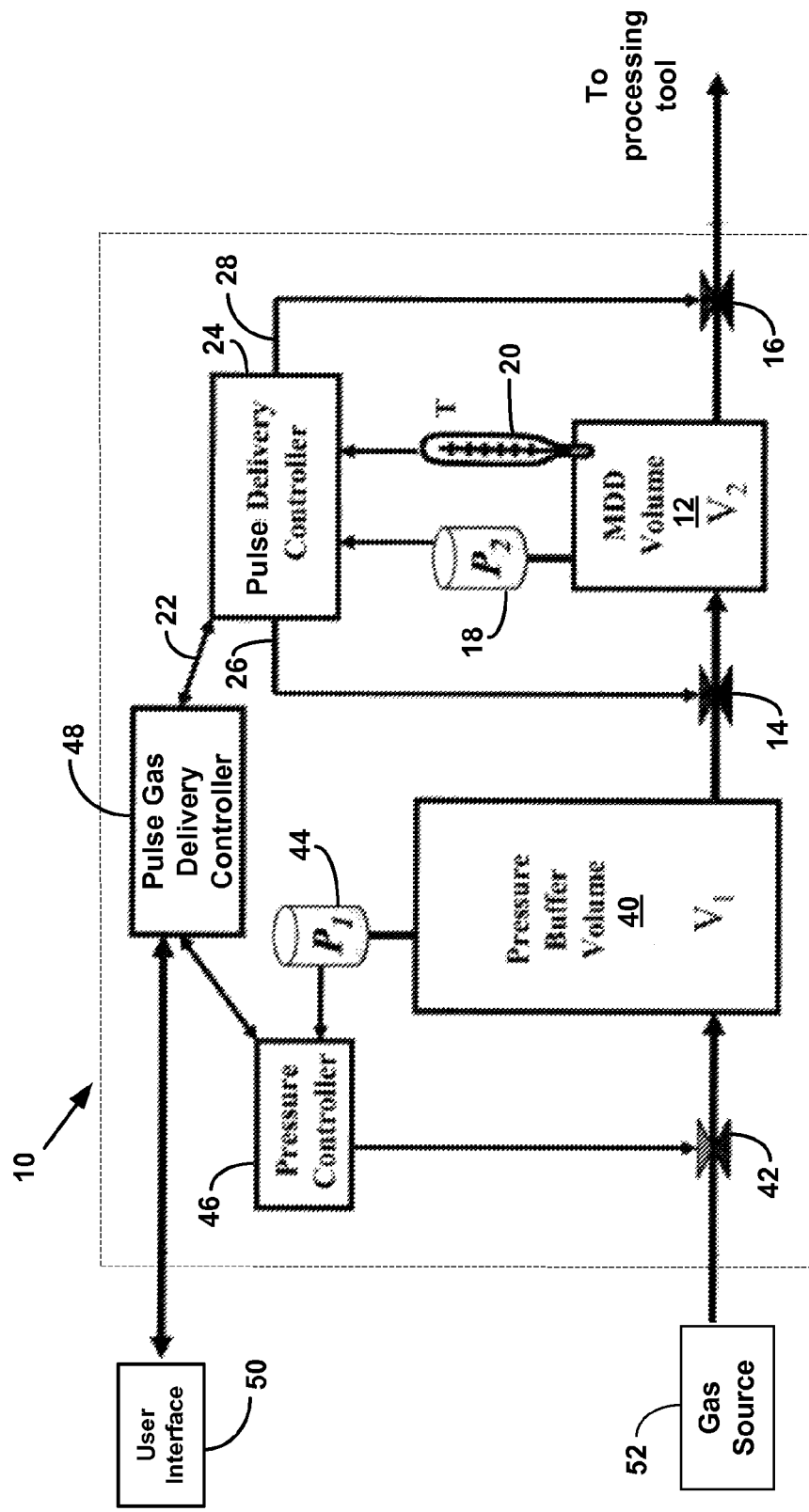
FIG. 1 is a block diagram of one embodiment of a gas delivery system for providing high speed pulse delivery.

FIG. 1 shows a block diagram of one embodiment of a system constructed to provide high speed pulse delivery of a gas. The system 10 and method carried out by using the system are particularly intended to deliver contaminant-free, precisely metered quantities of process gases to a semiconductor tool, such as a semiconductor processing chamber, or a plasma etching machine. The gas delivery system 10 reliably measures the amount of material (mass) flowing into the semiconductor tool, and provides for accurate delivery of the mass of a gas in pulses of relatively short duration in a reliable and repeatable fashion. Further, the system employs a more simplified operation, while providing delivery of the desired number of moles of gas over a wide range of values, without the need to divert gas to achieve the accurate, reliable and repeatable results.

In FIG. 1, the system 10 shown includes a gas delivery chamber or reservoir 12, inlet valve 14 controlling mass flow into the gas delivery chamber 12, and outlet valve 16 controlling mass flow out of the chamber 12. In the illustrated embodiment, the inlet and outlet valves are shut-off valves having relatively fast shut off responses, i.e., transition from an open state to a shut off state on the order of one to five milliseconds, although this can clearly vary.

The mass flow delivery system 10 also has a pressure sensor or transducer 18 for providing signals representative of measurements of pressure within the chamber 12 and a temperature sensor 20 for providing signals representative of measurements of temperature on or within the chamber 12. According to one exemplary embodiment of the present disclosure, the temperature sensor 20 is in contact with, and provides measurement of the temperature of a wall of the chamber 12.

A signal representing the desired mass flow is provided at the input 22 of the pulse delivery controller 24. Controller 24 also receives inputs representative of the pressure and temperature measured by the pressure transducer 18 and temperature sensor 20, respectively. Input 22 can also receive signals representing other processing instructions and various conditions. The system also includes one or more outputs 26 and 28 for providing control signals that are used to control the operation of the inlet and outlet valves 14 and 16, respectively. As will be more apparent hereinafter, the duration of the control signal used to open the inlet valve 14 is a function of the level of pressure that is desired in the delivery chamber 12 prior to delivering a pulse of gas, with the duration of the control signal used to open the outlet valve 16 is a function of the duration of the pulse of gas (which in turn is correlated to mass of gas delivered) delivered through the outlet valve.

In order to provide a more comprehensive solution for fast pulse mole delivery, speed up the delivery cycle and enable a very fast pulse mode delivery operation, improve the range and the accuracy of the pulse mode delivery doses, and reduce the operation complexity for users of the system, the system further includes additional components configured to provide a more controlled starting pressure within the delivery chamber 12 prior to delivery of gas though valve 16 to a tool so that the measured flow from chamber 12 is more accurate and repeatable, and can be operated at shorter pulse rates.

As shown in the embodiment illustrated in FIG. 1, the system 10 further comprises a buffer chamber or reservoir 40 for holding the gas to be delivered through the inlet valve 14 so that the pressure in the chamber 12 can be precharged to a predetermined level prior to delivering a dose or series of doses of the gas through the outlet valve 16. In order to control the gas from a gas source 52 into and out of the antechamber or buffer chamber 40, a control valve 42 is provided at the input of the buffer chamber 40 for controlling the flow of gas from a source of the gas into the chamber 40. Inlet control valve 42 can be a proportional control valve which is adapted to be controlled so as to maintain the pressure within the chamber 40 substantially at a constant predetermined level. It can remain open during the precharging step when gas is provided from chamber 40 through inlet valve 14 into the chamber 12, or closed as gas flows from the chamber 40 through inlet valve 14 into chamber 12. Further it can be controlled so that the pressure within the chamber is maintained regardless of whether gas is being delivered to the delivered to the process chamber. A pressure sensor or transducer 44 provides a signal representative of the pressure within chamber 40. A signal representative of the pressure is provided to pressure controller 46 and connected so as to provide a control signal to inlet valve 42 as a function of the pressure measurement. Finally, a main pulse gas delivery controller 48 is provided for controlling the entire system.

The controller 48 is configured to provide data and instructions to and from each of the controllers 24 and 46, as well as data and instructions to and from a user interface 50. User interface 50 can be any suitable device such as a computer including a keyboard and monitor configured so that an operator can use the interface to operate the gas delivery system 10. It should be apparent, that while three processors 24, 46 and 48 are shown, the system can operate with any number of controllers to carry out the functions of the three illustrated controllers, with a single device being more efficient. The buffer chamber 40 has a volume $V_1$ for containing gas received from the source 52. The gas provided in the chamber 40 is used to control the upstream pressure $P_1$ of the gas provided to the chamber 12. The starting pressure $P_2$ of the volume $V_2$ of gas or vapor in the chamber 12 can therefore be controlled. Thus, the variation of the initial charging pressure $P_2$ of volume $V_2$ prior to the delivery of each pulse can be minimized. The pressure set point of the gas in buffer volume $V_1$ of buffer chamber 40 is a function of gas type, the pulse gas delivery amount set point established by the user through the user interface 50, Specifically, $$P_{1,SP} = \text{function1}(gas\_type, pulse\_gas\_delivery\_setpoint); \quad (1)$$

wherein $P_{1,SP}$ is the pressure setpoint of the buffer chamber, gas_type is the properties of delivered gas such as molecular weight, heat capacity, thermal conductivity, and viscosity etc., and pulse_gas_delivery_setpoint is the setpoint of the pulse gas delivery amount for each dose.

Figure 2:
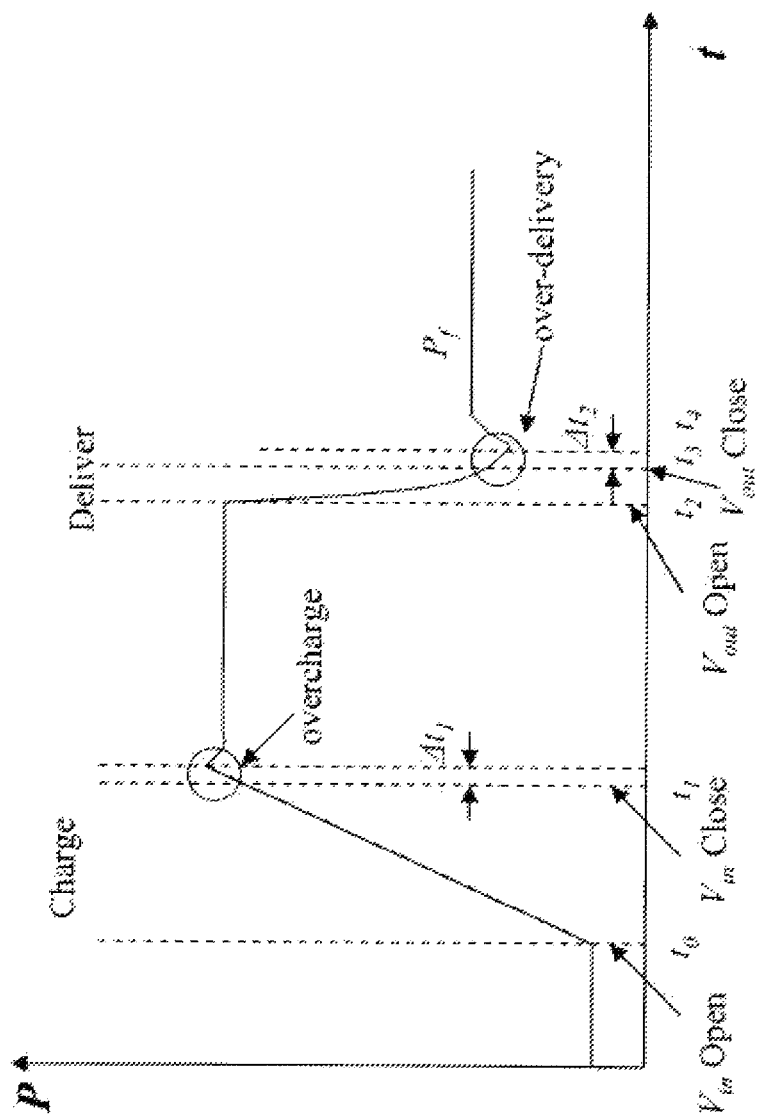
FIG. 2 is a graphical illustration of the pressure with in the chamber of the PGD shown in FIG. 1 vs time during the delivery of a pulse of gas from the delivery chamber.

Referring to FIG. 2, the graphical illustration shows the changes in pressure within delivery chamber 12 as the chamber is charged to a predetermined pressure level prior to delivering one or more pulses of gas, and then gas is discharged from the delivery chamber 12 during delivery of a pulse through the outlet valve 16.

Specifically, prior to time $t_0$, the inlet valve 42 is actively controlled such that the pressure in the buffer chamber 40, $P_1$, is regulated to the predetermined level such as defined in equation (1). At time $t_0$, the outlet valve 16 is closed and inlet valve 14 is open so that gas flow into the chamber 12 to the predetermined pressure $P_{2,SP}$ that is established by the pulse gas delivery controller 48 based upon the input provided through the user interface 50. Specifically, $$P_{2,SP} = \text{function2}(gas\_type, pulse\_gas\_delivery\_setpoint); \quad (2)$$

wherein $P_{2,SP}$ is the pressure setpoint of the delivery chamber, gas_type is the properties of delivered gas such as molecular weight, heat capacity, thermal conductivity, and viscosity etc., and pulse_gas_delivery_setpoint is the setpoint of the pulse gas delivery amount for each dose.

When the predetermined pressure $P_{2,SP}$ is reached, the inlet valve 14 is closed at time $t_1$. As can be seen in FIG. 2, an overcharge (or overshoot in pressure) occurs during the time interval $\Delta t_1$ (the time it takes for inlet valve to completely close), during which time the pressure will rise and then fall to a quiescent level. The pressure is allowed to settle. The system is thus charged and ready to deliver to predetermined molar amount of gas, delivered as a pulse through the outlet valve 16, which opens at time $t_2$ for a predetermined amount of time, and closing at time t3, when the programmed molar quantity has been delivered. As seen in FIG. 2, it takes a finite amount of time, $\Delta t_2$, for the outlet valve to complete close when it is commanded to close at time $t_3$. As a consequence there again will be some overshoot (over-delivery) of gas, before the gas in chamber settles at the final pressure $P_f$ as shown. The cycle can then be repeated using the gas in buffer chamber 40 to charge the delivery chamber 12 prior to delivery of the next pulse.

The amount of pulse gas delivered between $t_2$ and $t_2$ in FIG. 2, $\Delta n$, can be analyzed by the following equation:

$$\Delta n = \int_{t_2}^{t_4} Q \cdot dt = \int_{t_2}^{t_4} C_v(P - P_d) dt \quad (3)$$

$$\cong C_{v0} \int_{t_2}^{t_3} (P - P_d) dt + \left( \int_{t_3}^{t_4} C_v(t) dt \right) \cdot (P_f - P_d)$$

$$= C_{v0} \int_{t_2}^{t_3} (P - P_d) dt + IC_v \cdot (P_f - P_d)$$

wherein

Q is the flow rate through the outlet valve 16, $C_v$ or $C_v(t)$ the conductance of the valve which is a function of time as it opens or closes, $C_{v0}$ the full open valve conductance, $IC_v$, the integral value of valve conductance during the valve closing period from $t_3$ to $t_4$, P the pressure in delivery chamber 12, $P_f$ the final delivery chamber pressure, and
$P_d$ the downstream pressure of delivery chamber 12.

As shown, the term $IC_v \cdot (P_f - P_d)$ defines the amount of over-delivery in moles. Note that $IC_v$ is indeed a random variable, i.e. the closing time of the outlet valve is a random variable. If the system did not provide for precharging the chamber 12 with gas from a buffer chamber (such as 40) with a predetermined constant pressure $P_{1,SP}$, the starting delivery chamber pressure $P_2$ could vary, so that the amount this error would vary since the final chamber pressure value of $P_f$ would vary from cycle to cycle. The higher the starting pressure, the larger the affect of the error. By using the buffer volume of chamber 40, the upstream pressure provided by chamber 40 to the delivery chamber 12 is such that the variation of the charging pressure in chamber 12 is minimized with a much controlled constant upstream pressure. This assures that the error $IC_v \cdot (P_f - P_d)$ would be constrained to within a smaller range of errors. By constraining the error to be within a smaller range of errors, it is possible to provide better compensation for the errors in a repeatable manner so that delivery of the precise amount of gas in more accurate. By providing an upstream volume within a relatively constant pressure as a function of gas type and pulse gas delivery setpoint, the system is enabled to tightly control the charged pressure in chamber 12. Therefore, the variation on charged pressure is minimized which also minimized the repeatability error for pulse gas delivery caused by the valve time uncertainty.

Figure 3:
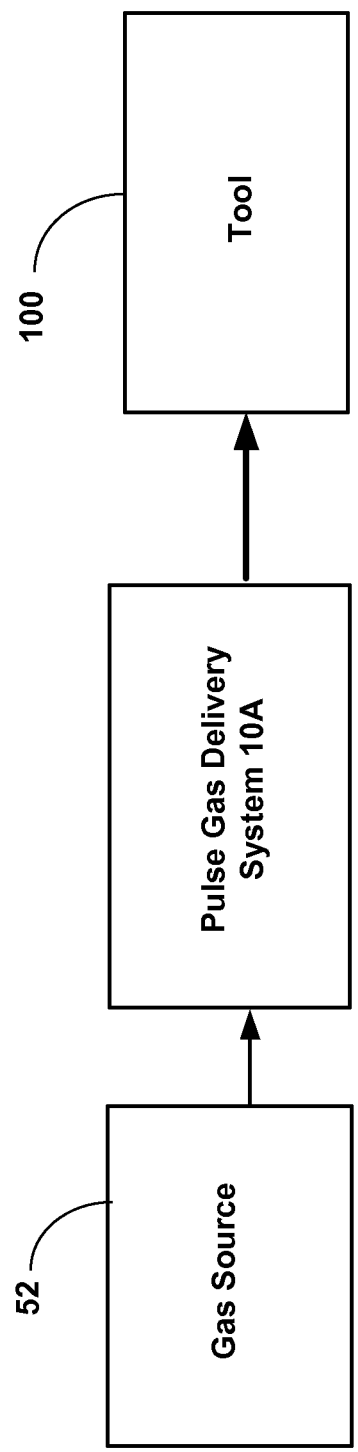
FIG. 3 is a block diagram of the use of the system coupled to a source of gas and a process tool.

One application for the pulse delivery system is to use the pulse delivery system, shown generally at 10A in FIG. 3, to control the pulses provided to a semiconductor tool shown at 100.

Figure 4:
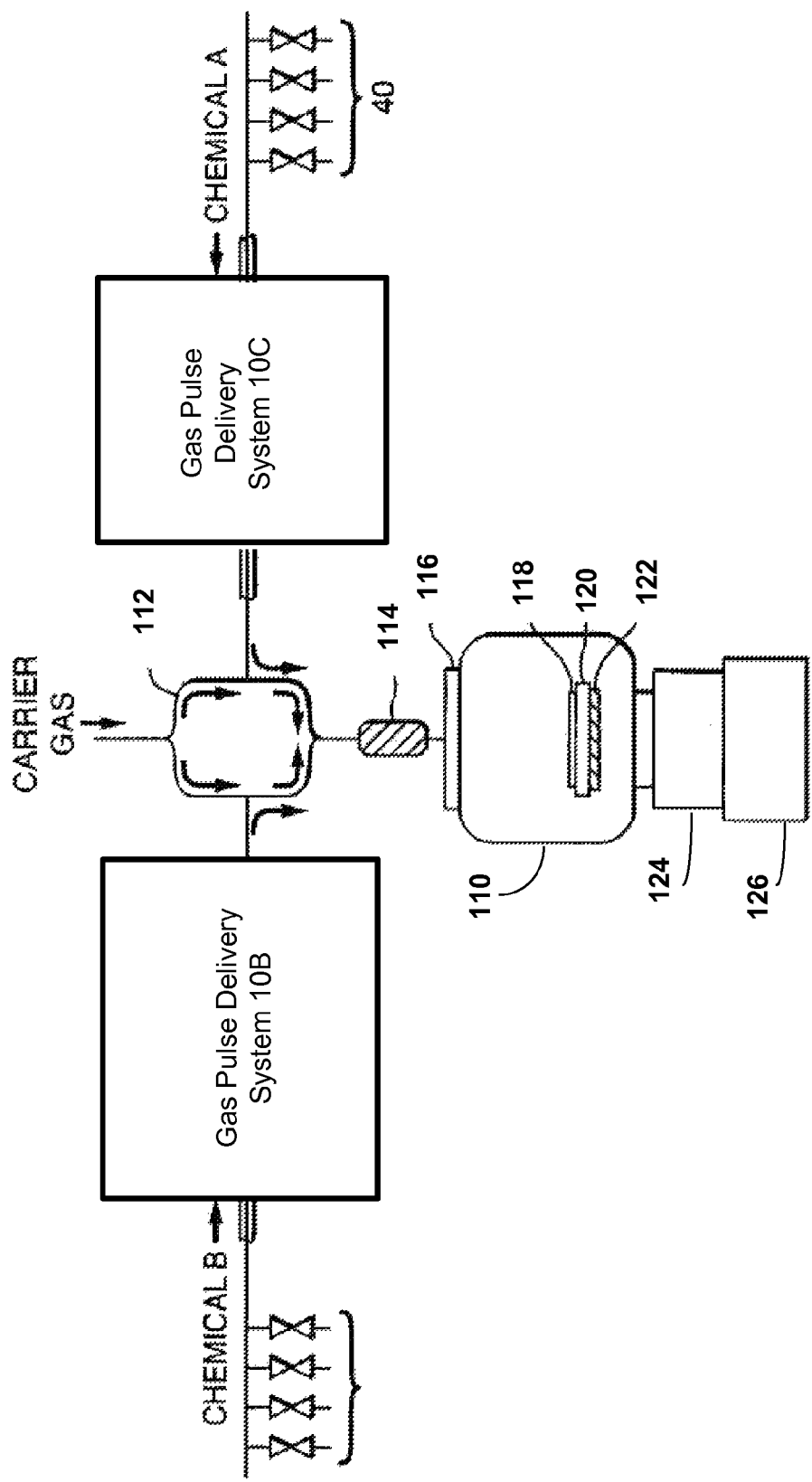
FIG. 4 is a partial block partial schematic diagram of an ALD system incorporating the gas delivery system of the type shown in FIG. 1.

Another application is to use two or more pulse delivery systems (two being shown at 10B and 10C in FIG. 4) of an atomic layer deposition system 110 such as the type described in U.S. Pat. No. 7,615,120, used in chemical vapor deposition (CVD) processes. For example, in such as system each system 10A and 10B is used to control the pulses of precursor gases provided to the ALD (atomic layer deposition) reactor 110. Specifically, gas is provided from either system 10B or 10C to the mixing manifold 112. The latter has two inlets for the introduction of gases from systems 10B and 10C. A carrier gas is introduced and the flow split at the mixing manifold. The carrier gas is typically an inert gas, such as nitrogen. In the example given chemistry A is a precursor provided from by system 10C and chemistry B is a precursor provided by system 10B. The carrier and precursor gases are mixed and provided to a plasma forming zone 114 for forming plasma of the mixed gases.

The plasma is provided to a gas distributor 116 which distributes the gas within the ALD reactor 110. A wafer 118 is disposed on a wafer support 120, both being heated by a heater 122. A throttle valve 124 and pump 126 are used to control the vacuum in the reactor 110, and evacuate the gases that are provided from the systems 10B and 10C during the process.

As described, the gas delivery system 10 reliably measures the amount of material (mass) flowing into the semiconductor tool, and provides for accurate delivery of the mass of a gas in pulses of relatively short duration in a reliable and repeatable fashion. Further, the system employs a more simplified operation, while providing delivery of the desired number of moles of gas over a wide range of values, without the need to divert gas to achieve the accurate, reliable and repeatable results.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

What is claimed is:

1. A system for delivering pulses of a desired mass of gas to a process chamber or tool, comprising:
    a gas delivery chamber;
    a first valve arranged so as to control the flow of gas into the gas delivery chamber;
    a second valve arranged so as control the flow of gas leaving the gas delivery chamber so that the gas can leave the gas delivery chamber in pulses, each of a selected mass as a function of the initial pressure of the gas in the gas delivery chamber; and
    a pressure control arrangement configured and arranged so as to control the pressure of the gas flowing into the gas delivery chamber so as to precharge the gas in the gas delivery chamber to a substantially-constant initial starting pressure set point prior to delivering each of the pulses of gas, such that variance in the starting pressure of the gas in the gas delivery chamber is controlled prior to delivering each of the pulses of gas, thus improving the repeatability of the mass delivery as a function of the duration of each of the pulses,
wherein the pressure control arrangement includes an antechamber constructed and arranged so as to receive the gas and selectively coupled to provide the substantially-constant pressure gas supply through the first valve into the gas delivery chamber so as to control the variance of the initial pressure of the gas in the gas delivery chamber before delivery of each of the pulses of gas.

2. A system according to claim 1, further including a pressure transducer arranged so as to provide a pressure signal as a function of the pressure within the gas delivery chamber, wherein the pressure control arrangement includes a controller for controlling the flow of gas into the gas delivery system as a function of the pressure signal.

3. A system according to claim 1, further including a temperature sensor arranged so as to provide a temperature signal as a function of the gas temperature within the gas delivery chamber, wherein the pressure control arrangement includes a controller for controlling the flow of gas into the gas delivery system as a function of the temperature signal.

4. A system according to claim 1, wherein the pressure control arrangement includes a first controller configured and arranged so as to control the flow of gas into and out of the gas delivery chamber as a function of the pressure within the gas delivery chamber.

5. A system according to claim 1, wherein the pressure control arrangement is further configured and arranged so as to control the first valve so as to control the flow of gas from the antechamber into the gas delivery chamber so as to control the variance of the initial pressure of the gas in the gas delivery chamber before delivery of pulses of gas.

6. A system according to claim 1, further including a first pressure transducer arranged so as to provide a first pressure signal as a function of the pressure within the gas delivery chamber, and a second pressure transducer arranged so as to provide a second pressure signal as a function of the pressure within the antechamber, wherein the pressure control arrangement includes a controller for controlling the flow of gas into the gas delivery system as a function of the first and second pressure signals.

7. A system according to claim 6, further including a third valve arranged so as to control the flow into the antechamber, and wherein the pressure control arrangement is configure and arranged so as to control the third valve so as to control the flow of gas into the antechamber as a function of the second pressure signal, control the first valve so as to control the flow of fluid from the antechamber into the gas delivery chamber as a function of the first and second pressure signals, and control the flow of gas leaving the gas delivery chamber as a function of the first pressure signal.

8. A system according to claim 7, wherein the controller arrangement includes a first controller configured and arranged so as to control the first and second valves, and a second controller configured and arranged so a to control the third valve, and a third controller configured and arranged so as to control the first and second controllers.

9. A system according to claim 1, wherein the antechamber is selectively coupled to the gas delivery chamber so as to charge the gas delivery chamber with the gas through the first valve.

10. A system according to claim 1, wherein the controller arrangement is configured and arranged so as to control the third valve so as to maintain the pressure in the antechamber at a select pressure.

11. A system according to claim 10, wherein the initial pressure set point in the gas delivery chamber is a function of gas type and the selected mass of the pulse of gas to be delivered.

12. A system according to claim 1, wherein the system is for delivering pulses of a desired mass of gas to a wafer in a process chamber or tool.

13. A system according to claim 1, wherein the system is for delivering pulses of a desired mass of gas to a substrate in a process chamber or tool.

14. A system according to claim 1, wherein the system is for delivering pulses of a desired mass of gas to a semiconductor tool.

15. A system according to claim 1, wherein the system is for delivering pulses of a desired mass of gas to a semiconductor processing chamber.

16. A system according to claim 1, wherein the system is for delivering pulses of a desired mass of gas to a plasma etching machine.

17. A system according to claim 1, wherein the pressure control arrangement causes the first valve to close when the initial starting pressure set point is reached.

* * * * *